(12) United States Patent
Kouno et al.

(10) Patent No.: US 7,155,767 B2
(45) Date of Patent: Jan. 2, 2007

(54) SCRUB CLEANING DEVICE, SCRUB CLEANING METHOD, AND MANUFACTURING METHOD OF INFORMATION RECORDING MEDIUM

(75) Inventors: Hiroshi Kouno, Tokyo (JP); Masahumi Kanahara, Tokyo (JP)

(73) Assignee: Hoya Corporation (JP)

( * ) Notice: Subject to any disclaimer, the term of this patent is extended or adjusted under 35 U.S.C. 154(b) by 0 days.

(21) Appl. No.: 10/620,948

(22) Filed: Jul. 16, 2003

(65) Prior Publication Data

US 2004/0016451 A1     Jan. 29, 2004

Related U.S. Application Data

(62) Division of application No. 09/606,943, filed on Jun. 29, 2000, now Pat. No. 6,620,257.

(30) Foreign Application Priority Data

Jun. 30, 1999  (JP) ................... 11-186386

(51) Int. Cl.
  *B08B 1/02*   (2006.01)
  *B08B 1/04*   (2006.01)
(52) U.S. Cl. .............. 15/88.2; 15/77; 15/97.1; 15/102; 134/6; 134/902
(58) Field of Classification Search ............. 15/77, 15/88.2, 97.1, 102; 134/6, 902
  See application file for complete search history.

(56) References Cited

U.S. PATENT DOCUMENTS

| | | | | |
|---|---|---|---|---|
| 4,811,443 A | * | 3/1989 | Nishizawa | 15/97.1 |
| 5,144,711 A | * | 9/1992 | Gill, Jr. | 15/97.1 |
| 5,311,634 A | * | 5/1994 | Andros | 15/97.1 |
| 5,351,360 A | * | 10/1994 | Suzuki et al. | 15/302 |
| 5,555,177 A | | 9/1996 | Simmons | 364/468.28 |
| 5,870,792 A | * | 2/1999 | Shurtliff | 15/102 |
| 5,894,622 A | * | 4/1999 | Manfredi et al. | 15/102 |
| 6,006,391 A | * | 12/1999 | Shurtliff et al. | 15/102 |
| 6,012,192 A | * | 1/2000 | Sawada et al. | 15/77 |
| 6,059,888 A | * | 5/2000 | Hillman | 134/6 |
| 6,290,780 B1 | * | 9/2001 | Ravkin | 134/6 |
| 6,379,230 B1 | | 4/2002 | Hayashi et al. | 451/292 |

FOREIGN PATENT DOCUMENTS

JP     9-206705     8/1997

* cited by examiner

*Primary Examiner*—Alexander Markoff
(74) *Attorney, Agent, or Firm*—Cook, Alex, McFarron, Manzo, Cummings & Mehler, Ltd.

(57) ABSTRACT

There is disclosed a scrub cleaning device which can reduce cleaning time and which requires no large-scaled device for transferring a substrate to the next cleaning process. The scrub cleaning device comprises: a scrub pad 10 provided with two annular plate scrubbers 11, 11', and wheels 12, 12' for supporting an inner peripheral surface A of the annular plate scrubber and a surface B opposite a scrub surface so that the scrub surfaces of the two annular plate scrubbers 11, 11' fit each other, and for rotating the scrubber around-the central shaft of the annular plate scrubber; and a guide member (not shown), disposed along the outer periphery of the scrub pad 10, for conveying the substrate in the rotation direction of the scrub pad 10, and the scrub cleaning of the substrate is performed when the substrate held between the two opposite scrubbers 11, 11' is conveyed in the rotation direction of the scrubbers 11, 11' by rotation of the scrub pad 10, and rotated by a friction force generated by abutment on the guide member.

10 Claims, 9 Drawing Sheets

SCRUB CLEANING DEVICE, SCRUB CLEANING METHOD, AND MANUFACTURING METHOD OF INFORMATION RECORDING MEDIUM

REFERENCE TO RELATED APPLICATION

This application is a divisional of U.S. application Ser. No. 09/606,943, filed on Jun. 29, 2000 now U.S. Pat. No. 6,620,257.

This application claims the priority right under Paris Convention of Japanese Patent Application No. 186386/2000 filed on Jun. 30, 1999, the entire disclosure of which is incorporated herein by reference.

BACKGROUND OF THE INVENTION i) Field of the Invention

The present invention relates to a scrub cleaning method, a scrub cleaning device for scrub-cleaning the main surface, and a manufacturing method of an information recording medium, for example, of an information recording medium glass substrate, a semiconductor wafer, or another disc-shaped substrate using a sponge, a brush or the like.

ii) Description of Related Art

In a disc substrate cleaning device described in Japanese Patent Application Laid-Open No. 206705/1997, a plurality of cleaning stations are arranged, a disc substrate (a circular plate having a central hole) is successively moved through the respective cleaning stations by a transfer device (lifting hook), and the disc substrate is scrub-cleaned by a columnar scrub roller.

In the disc substrate cleaning device, when the disc substrate is transferred to the respective cleaning stations, transfer (conveyance among the cleaning stations) is performed by supporting the central hole of each substrate by the lifting hook, a transfer device needs to be separately disposed, and there is a problem that the device is enlarged in scale. Moreover, when the transfer is performed by supporting the central hole by the lifting hook, there is a problem that the central hole is rubbed and dust is possibly generated.

Furthermore, since much time is required for the transfer to the respective cleaning stations, there is a problem that cleaning time for performing a plurality of cleaning processes is lengthened. Specifically, when the transfer is performed by supporting the central hole of each substrate by the lifting hook, much time is required for a series of operations of substrate stopping, central hole supporting (chucking), transferring, and support (chucking) releasing, and the cleaning time is lengthened. Moreover, when much time is required for the transfer, the substrate dries, and a problem arises that dirt cannot easily be removed.

Particularly, in a one-inch substrate for use in a storage device of a cellular phone, digital camera, car navigation system or the like, since the central hole is small, it is very difficult, with respect to precision and cost, to perform the transfer by supporting the central hole by the lifting hook.

SUMMARY OF THE INVENTION

To solve the aforementioned problems, according to the present invention, the following constitutions are provided.

(Constitution 1) A scrub cleaning device comprising: two planar scrubbers; means for supporting the two planar scrubbers so that scrub surfaces are disposed opposite to each other; means for rotating the planar scrubber around a rotation shaft vertical to-the planar scrubber; and a guide member disposed so that a substrate held between the two opposite scrubbers may be conveyed in the rotation direction of the scrubber, wherein the substrate held between said two opposite scrubbers is conveyed in the scrubber rotation direction by the rotation of the scrubber, and rotated by a friction force generated by abutment on said guide member, so that the substrate is scrubbed/cleaned.

(Constitution 2) A scrub cleaning device comprising, a scrub pad comprising: two annular plate scrubbers, and a wheel for supporting the inner peripheral surface of the annular plate scrubber and the surface opposite a scrub surface so that the scrub surfaces of said two annular plate scrubbers fit each other, and for rotating the scrubber around the center shaft of the annular plate scrubber; and a guide member disposed opposite to the wheel on the inner peripheral surface side of the annular plate scrubber and disposed along the outer periphery of the scrub pad so that a substrate may be conveyed in the rotation direction of said scrub pad, wherein the substrate held between said two opposite scrubbers is conveyed in the rotation direction of the scrubber between the wheel on the inner peripheral surface side of the annular plate scrubber and the guide member by the rotation of the scrub pad, and rotated by a friction force generated by abutment on said guide member, so that the substrate is scrubbed/cleaned.

(Constitution 3) A scrub cleaning device comprising: a substrate cleaning section, provided with means for moving a scrubber while at least a part of a substrate is held between two opposite scrubbers, and conveying the substrate in the movement direction of the scrubber, and friction generation means, disposed along the conveyance direction of the substrate, for abutting on the conveyed substrate to generate a friction, for conveying and scrubbing/cleaning the substrate when the substrate is conveyed and rotated by a friction force generated by abutment of the substrate on the friction generation means; a substrate inlet section for conveying the substrate into said substrate cleaning section; and a substrate outlet section for conveying the substrate from said substrate cleaning section.

(Constitution 4) A scrub cleaning device comprising: a pair of scrubbers which are rotatably supported by and rotate driven by a rotation driving means; a substrate inlet section for conveying a substrate prior to cleaning into a gap between the pair of scrubbers; a substrate cleaning section for cleaning the substrate transferred from the substrate inlet section with a cleaning liquid supplied from a cleaning liquid supply means; a substrate outlet section for discharging the cleaned substrate transferred from the substrate cleaning section; and a conveyance guiding section for conveying the substrate in cooperation with the scrubbers from the substrate inlet section to the substrate cleaning section, and from the substrate cleaning section to the substrate outlet section, wherein the substrate cleaning section further comprises a resistant force supply means for supplying a resistant force to resist against a force in a conveyance direction provided to the substrate by the scrubbers, so that the substrate is scrubbed/cleaned by a differential peripheral speed between the substrate and the scrubbers generated by the resistant force supply means.

(Constitution 5) The scrub cleaning device according to constitution 3 or 4, wherein a sensor for confirming the presence/absence of the substrate is disposed on at least one of the substrate cleaning section, the substrate introducing section and the substrate discharging section.

(Constitution 6) The scrub cleaning device according to any one of constitutions 1 to 5, further comprising stop means for abutting on the substrate conveyed in the rotation direction of the scrubber to temporarily stop the conveyance of the substrate, and forcibly performing the scrub cleaning of the substrate.

(Constitution 7) The scrub cleaning device according to constitution 6, wherein a sensor for confirming the presence/absence of the substrate is disposed at a position where the conveyance of the substrate is temporarily stopped.

(Constitution 8) A scrub cleaning device comprising: a plurality of cleaning stations comprising the constitution according to any one of constitutions 1 to 7; and a conveyance mechanism for conveying a substrate cleaned in the cleaning station to the next cleaning station in said plurality of cleaning stations.

(Constitution 9) The scrub cleaning device according to constitution 8 wherein said conveyance mechanism comprises a guide member for connecting the scrubbers of said plurality of cleaning stations to one another.

(Constitution 10) The scrub cleaning device according to constitution 8 wherein said conveyance mechanism comprises a guide member for connecting the scrubbers of said plurality of cleaning stations to one another, and a scrub roller for holding the substrate along the guide member from opposite sides and conveying the substrate.

(Constitution 11) The scrub cleaning device according to any one of constitutions 1 to 10, further comprising cleaning liquid supply means for supplying a cleaning liquid to at least one of the scrubber and the substrate held between two scrubbers.

(Constitution 12) The scrub cleaning device according to any one of constitutions 1 to 11, comprising a vertically disposed device for holding the vertically disposed substrate from opposite sides between two vertically disposed scrubbers.

(Constitution 13) The scrub cleaning device according to any one of constitutions 1 to 12 wherein said substrate is a glass substrate for an information recording medium.

(Constitution 14) A scrub cleaning method comprising the steps of: rotating a scrubber while a substrate is held between two opposite planar scrubbers; conveying the substrate in the rotation direction of the scrubber; and generating a peripheral speed difference between the substrate and the scrubber by rotation of the scrubber to perform the scrub cleaning of the substrate.

(Constitution 15) The scrub cleaning method according to constitution 14, further comprising the step of stopping the substrate conveyed by the scrubber in a predetermined position, and performing the scrub cleaning of the substrate.

(Constitution 16) The scrub cleaning method, according to constitution 14 or 15, comprising a substrate cleaning section for performing the scrub cleaning of the substrate, a substrate inlet section for introducing the substrate into said substrate cleaning section, and a substrate outlet section for discharging the substrate from said substrate cleaning section, wherein said substrate is conveyed from the substrate inlet section to the substrate cleaning section, and from the substrate cleaning section to the substrate outlet section in this order.

(Constitution 17) The scrub cleaning method according to constitution 16, wherein a sensor for confirming the presence/absence of the substrate is disposed in at least the substrate cleaning section, and the sensor confirms that any substrate is not present in the substrate cleaning section when the plurality of substrates are subjected to the scrub cleaning, and the substrates are then conveyed from the substrate inlet section to the substrate cleaning section.

(Constitution 18) A manufacturing method of an information recording medium which comprises the steps of subjecting a substrate for an information recording medium to scrub cleaning, and then forming at least a recording layer on the substrate, wherein the scrub cleaning method described in any one of constitutions 14 to 17 is carried out.

In the scrub cleaning method and device of the present invention, the scrubber for performing the scrub cleaning has a function of conveying the substrate to respective cleaning points, the conveyance and transfer of the substrate are smoothly performed, time for transfer to the next cleaning station is shortened, and cleaning time is reduced.

Figure 8:
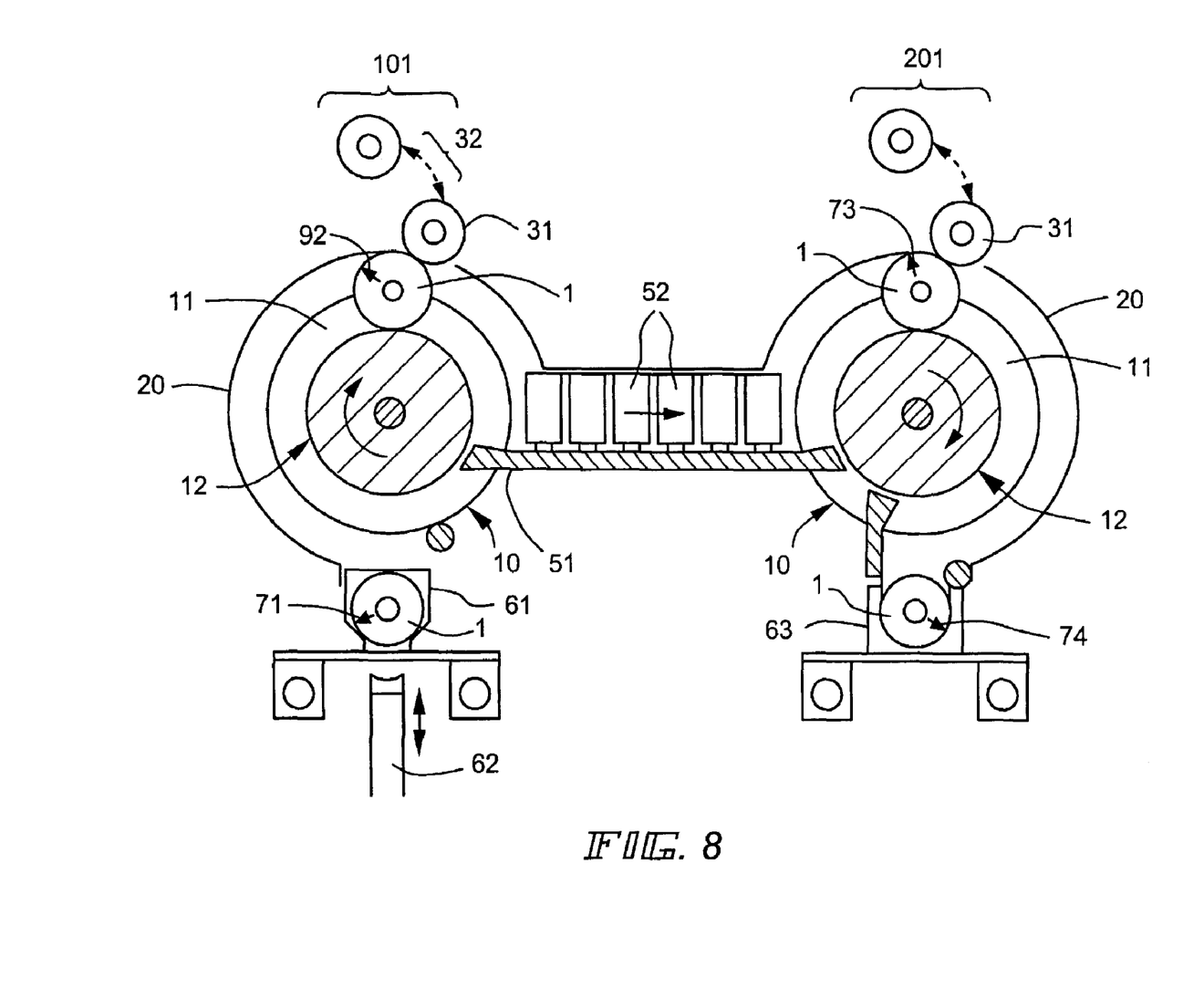
FIG. 8 is a main part front view showing a method of disposing a sensor for detecting the substrate in the scrub cleaning device and controlling and managing the flow of the substrate.

In the present invention, in the device a sensor for detecting the substrate is disposed, and substrate flow can be controlled and managed. For example, as shown in FIG. 8, the container cassette 61, a cleaning point 101 of the first cleaning station, a cleaning point 201 of the second cleaning station and the container cassette 63 are provided with substrate detecting sensors 71, 72, 73, 74, respectively, so that the substrate flow can be controlled and managed. In FIG. 8, the sensor 71 confirms the presence/absence of the substrate 1 in a substrate discharge position in the container cassette 61. The sensor 72 confirms the presence/absence of the substrate 1 in the cleaning point 101 of the first cleaning station. The sensor 73 confirms the presence/absence of the substrate 1 in the cleaning point 201 of the second cleaning station. The sensor 74 confirms the presence/absence of the substrate 1 in the substrate storage position in the container cassette 63. In the container cassette 61, after the sensor 71 confirms that the substrate 1 exists in the substrate discharge position, and the sensor 72 further confirms that the substrate 1 is absent in the cleaning point 101 of the first cleaning station, the substrate 1 is conveyed to the space between the constantly rotating sponge pieces 11 and 11' (not shown) of the scrub pad 10. When the sensor 71 confirms that the substrate 1 is absent in the substrate discharge position, the cassette is moved to the next substrate discharge position. In the cleaning point 101 of the first cleaning station, the substrate 1 reaches the position of the free roller 31, the sensor 72 confirms the presence of the substrate 1, then a timer operates and the cleaning is performed in the cleaning point 101 for a fixed time. After it is confirmed that a timer set time elapses (time-up), and the sensor 73 further confirms that no substrate 1 exists in the cleaning point 201 of the second cleaning station, the free roller 31 is retracted and the substrate 1 is passed. When the substrate is passed, the free roller 31 is immediately lowered to its original position. In the cleaning point 201 of the second cleaning station, when the substrate 1 reaches the position of the free roller 31 and the sensor 73 confirms the presence of the substrate 1, the timer operates and the cleaning is performed in the cleaning point 201 for the fixed time. After it is confirmed that the timer set time elapses (time-up), and the sensor 74 further confirms that no substrate 1 exists in the substrate storage position in the container cassette 63, the free roller 31 is retracted and the substrate 1 is passed. When the substrate is passed, the free roller 31 is immediately lowered to its original position. In the container cassette 63, when the sensor 74 confirms that the substrate 1 exists in the substrate storage position, the cassette is moved to the next substrate storage position. In this manner, by passing the substrate after it is confirmed that no substrate exists in the prior process position, a trouble can be prevented from being caused by collision of the substrate.

Additionally, preferably employed is a system which comprises: confirming by the sensor and timer mechanism that the substrate fails to reach the corresponding position even when time required for a series of processes from the discharging to the storing of the substrate elapses, or confirming by the respective sensors and timer mechanism that a predetermined operation time in each sensor position elapses, notifying troubles such as the catching and dropping of the substrate by a buzzer or the like, or stopping the device.

The position and number of the sensors are not limited to the form shown in the drawing, and can appropriately be set. The sensor type is not limited as long as the substrate can be detected, and for example, a sensor for detecting the substrate by reflection of laser beams can be used.

It goes without saying that the respective operations can be performed only by time management without disposing any sensor.

Figure 9A:
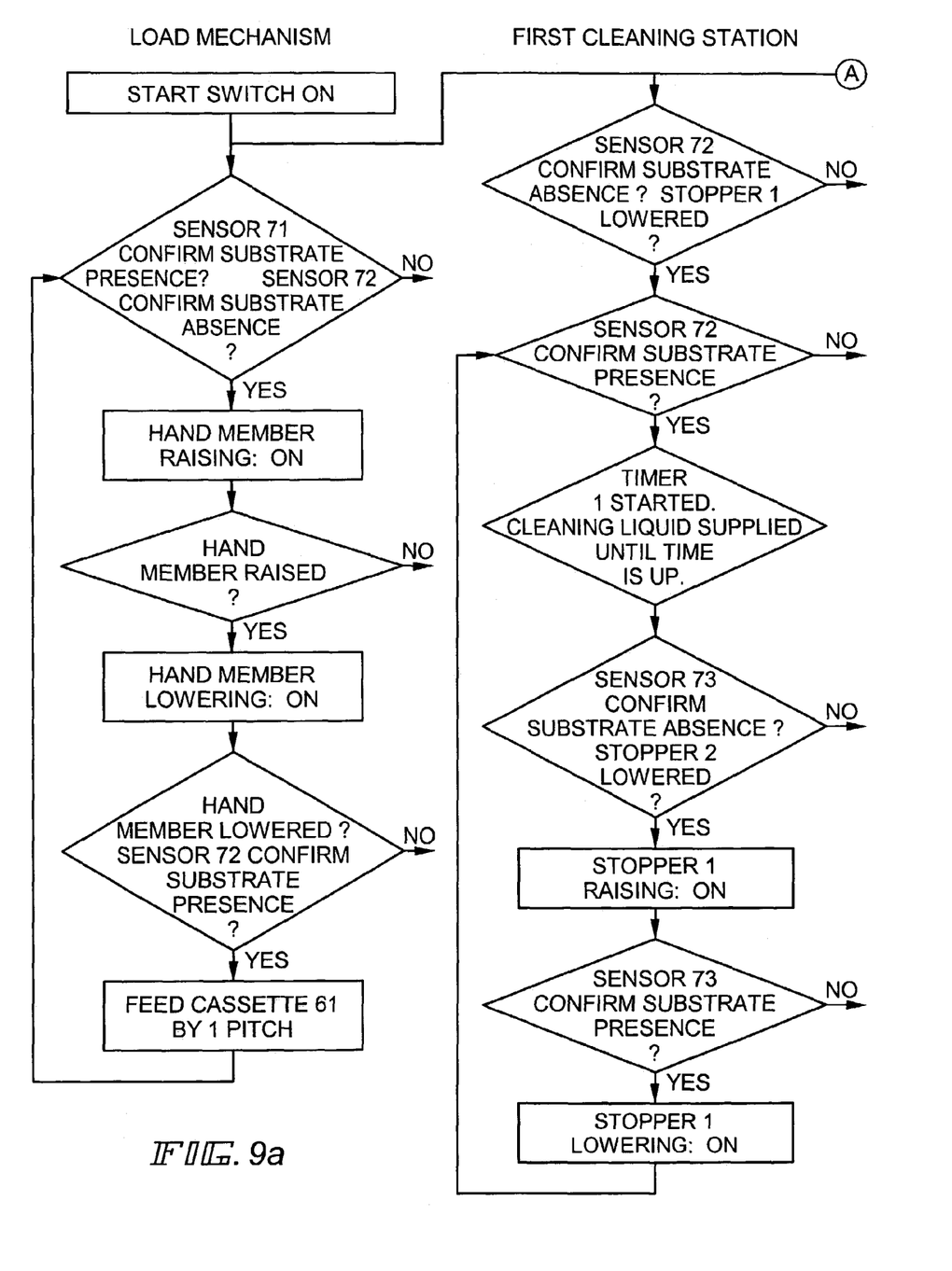
FIG. 9 is a flowchart showing a process of disposing the sensor and controlling and managing the substrate flow or a signal system diagram.
Figure 9B:
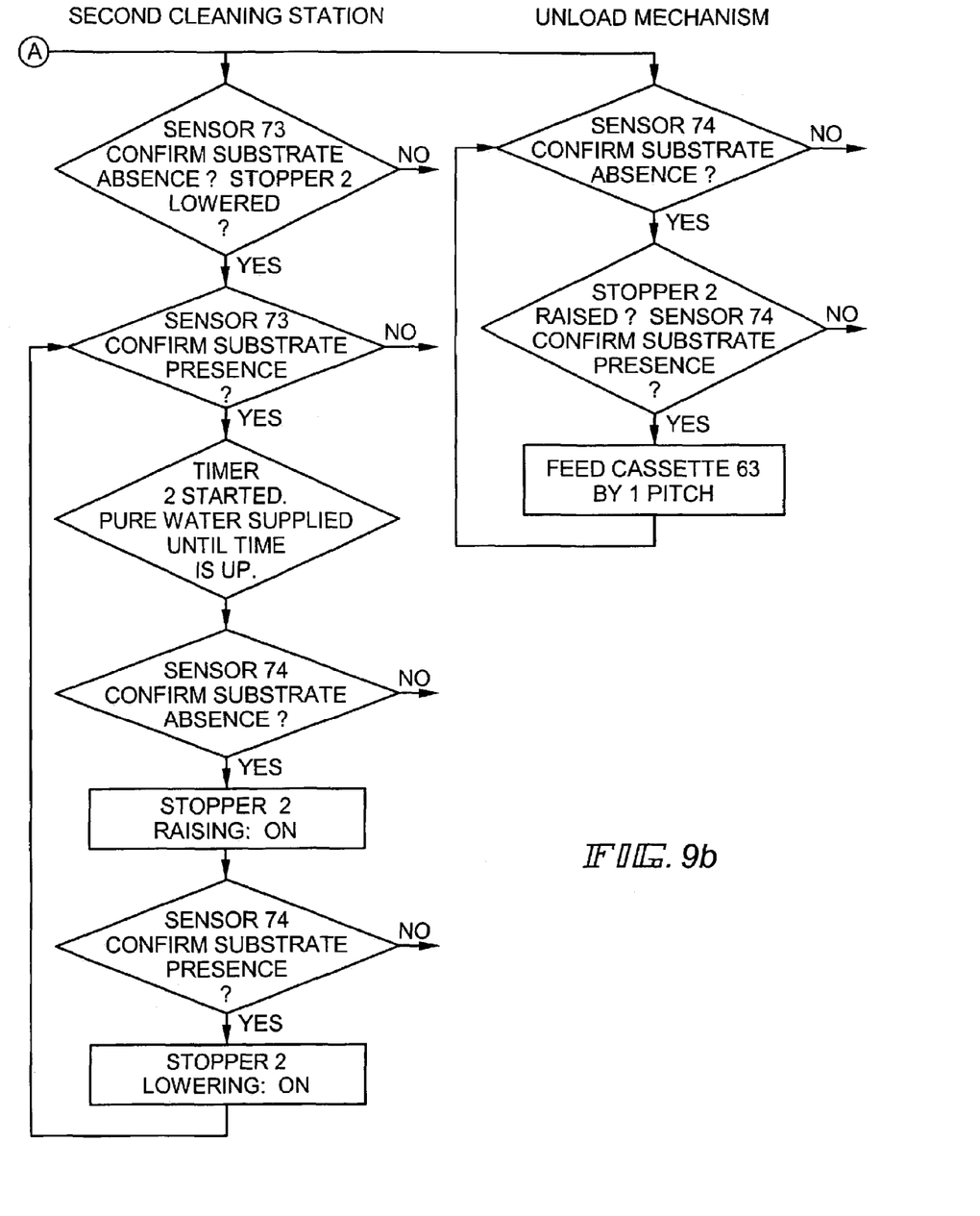

A concrete example of a flowchart showing the above-described substrate flow control is shown in FIG. 9. In FIG. 9, when a start switch is turned on, first as confirmation of an initial state, it is checked (1) whether the cassette 61 for containing the substrate to be cleaned and the empty cassette 63 are exactly installed in predetermined positions (not shown), (2) whether the scrub pad 10 (hereinafter referred to as wheel 1) of the first cleaning station and the scrub pad 10 (hereinafter referred to as wheel 2) of the second cleaning station rotate (not shown), (3) whether the sensor 71 confirms the presence of the substrate and the sensors 72, 73, 74 confirm the absence of the substrate, and (4) whether the free roller 31 (hereinafter referred to as stopper 1) of the first cleaning station and the free roller 31 (hereinafter referred to as stopper 2) of the second cleaning station are lowered. When even one condition is not satisfied, an alarm buzzer is turned on, and an alarm is issued.

After confirmation of the initial state, in the loading mechanism, a hand member raising switch is turned on, and on confirmation of the raising of the hand member, a hand member lowering switch is turned on. When the lowering of the hand member is confirmed, and the sensor 72 confirms the presence of the substrate, the cassette 61 is fed by one pitch. Thereafter, the process returns to the confirming of the presence of the substrate by the sensor 71, and the confirming of the absence of the substrate by the sensor 72, and the same process is repeated.

In the first cleaning station, after the initial state is confirmed, on confirmation of the presence of the substrate by the sensor 72, the timer 1 starts and the cleaning liquid is supplied until the time is up. After the sensor 73 confirms the absence of the substrate, and the lowering of the stopper 2 is confirmed, a raising switch of stopper 1 is turned on. When the sensor 73 confirms the presence of the-substrate, a lowering switch of stopper 1 is turned on. Thereafter, the process returns to the confirming of the presence of the substrate by the sensor 72, and the same process is repeated.

In the second cleaning station, after the initial state is confirmed, and the sensor 73 then confirms the presence of the substrate, the timer 2 starts and pure water is supplied to perform rinsing until the time is up. After the sensor 74 confirms the absence of the substrate, a raising switch of stopper 2 is turned on. When the sensor 74 confirms the presence of the substrate, a lowering switch of stopper 2 is turned on. Thereafter, the process returns to the confirming of the presence of the substrate by the sensor 73, and the same process is repeated.

In the unloading mechanism, after the initial state is confirmed, the raising of the stopper 2 is confirmed, and the sensor 74 then confirms the presence of the substrate, the cassette 63 is fed by one pitch. Thereafter, the process returns to the confirming of the absence of the substrate by the sensor 74, and the same process is repeated.

Additionally, when the respective judgment results are "No", the alarm buzzer is turned on and the alarm is issued. Moreover, FIG. 9 shows one example of the. flowchart, and can appropriately be changed. For example, instead of the sensors 72, 73, a sensor for confirming the presence of the substrate in the respective wheels 1 and 2 can be disposed. Moreover, the process can be designed so that on confirmation of the raising of the hand member, the timer 1 is started and the cleaning liquid is supplied until the time is up. The process can also be designed so that similarly on confirmation of the raising of the stopper 1, the timer 2 is started and pure water is supplied until the time is up.

Furthermore, the disc substrate can be conveyed without supporting the central hole, and hence there is not any fear that the central hole is not worn to form dust, so that the generation of a thermal asperity due to the formation of the dust from the central hole can be prevented, whereby the information recording medium (e.g., a magnetic disc) having a high reliability can be manufactured.

In the present invention, the substrate held between two scrubbers is conveyed in the rotation direction by rotation of the scrubber, the peripheral speed difference is generated between the substrate and the scrubber by the friction force generated by abutment of the substrate on the guide member, and the substrate and scrubber rub each other to perform the scrub cleaning.

In order to generate the friction force between the substrate and the guide member, that is, to generate the peripheral speed difference between the substrate and the scrubber, there is provided the stop means (inhibition means) for abutting on the substrate conveyed in the rotation direction of the scrubber to temporarily stop the conveyance of the substrate (e.g., a rotatable free roller), or the holding amount (substrate holding pressure) of the substrate by the scrubber is adjusted. In the latter case, since the substrate rotates during conveyance, the conveying and the scrub cleaning of the substrate are simultaneously performed.

According to the present invention, since it is unnecessary to dispose a large-scaled device for supporting each of the respective substrates and conveying or transferring the substrate to the cleaning point or the next cleaning station, the device can be simplified and miniaturized, and the space can be saved. Particularly, with the vertically disposed device in which the vertically disposed substrate is held from opposite sides between two vertically disposed scrubbers, the space can further be saved.

According to the present invention, there is no fear of dust generation by the rubbing of the central hole, or there is no possibility that the substrate dries or dirt cannot easily be removed.

In the present invention, by disposing the cleaning liquid supply means for supplying the cleaning liquid at least one or preferably both of the scrubber, and the substrate held between two scrubbers, during the cleaning or conveyance, the substrate preferably fails to dry. It is further preferable to also provide the transfer mechanism between the cleaning stations with the supply means of the cleaning liquid (including water).

In the present invention, by disposing the stop means for forcibly performing the scrub cleaning of the substrate, the cleanliness of the substrate is preferably satisfactory.

For the scrub cleaning method and device of the present invention, even when a plurality of cleaning processes are performed, the cleaning time is short, and it is unnecessary to dispose the large-scaled transfer device, which is useful particularly for performing a plurality of cleaning processes.

As the substrate to be cleaned according to the present invention, disc-shaped substrates such as an information recording medium substrate are exemplified. The present invention is suitable particularly for a one-inch substrate, and other substrates difficult to transfer or clean because of the small size.

DETAILED DESCRIPTION OF THE PREFERRED EMBODIMENTS

EXAMPLE 1

Figure 1:
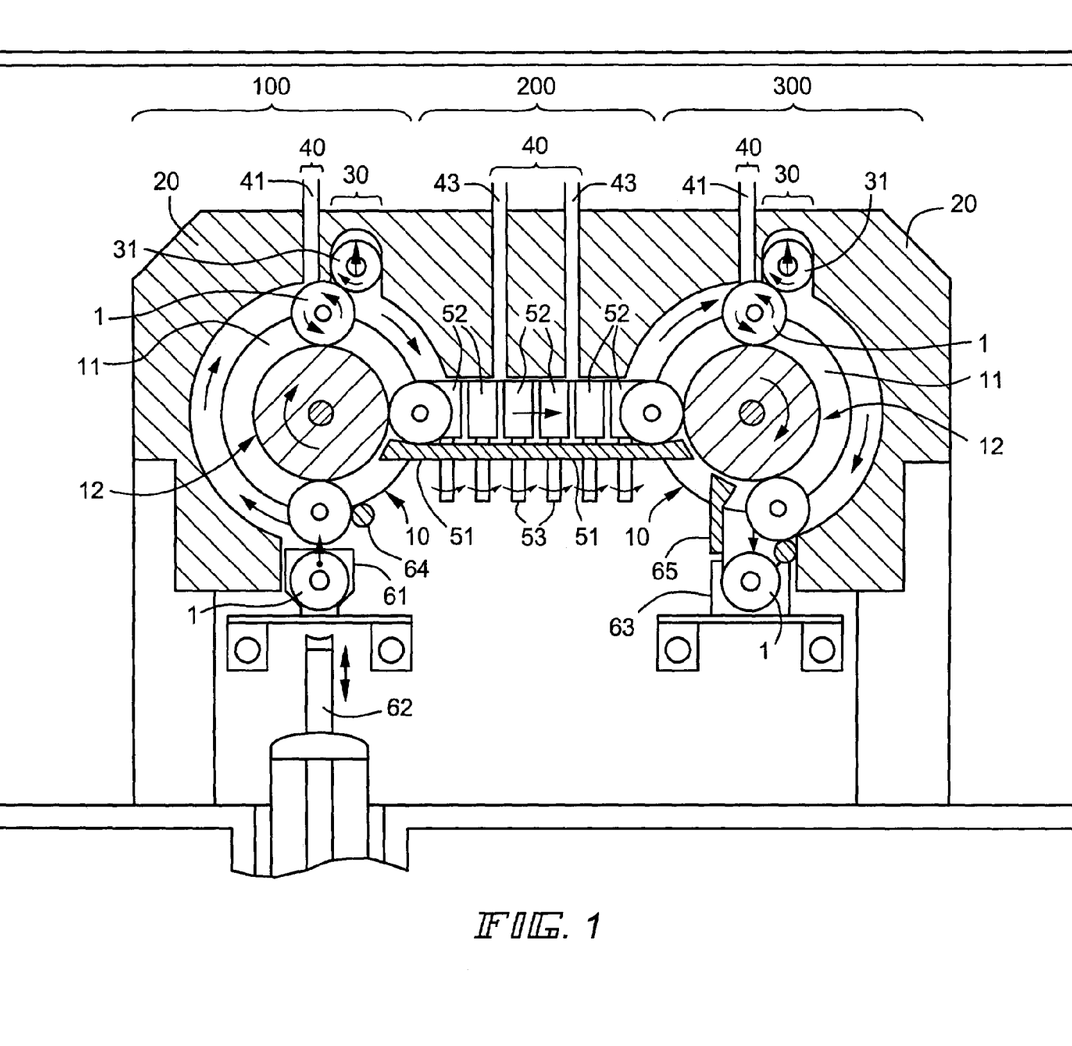
FIG. 1 is a sectional view schematically showing a scrub cleaning device according to a first embodiment of the present invention.
Figures 5, 5A, 5B:
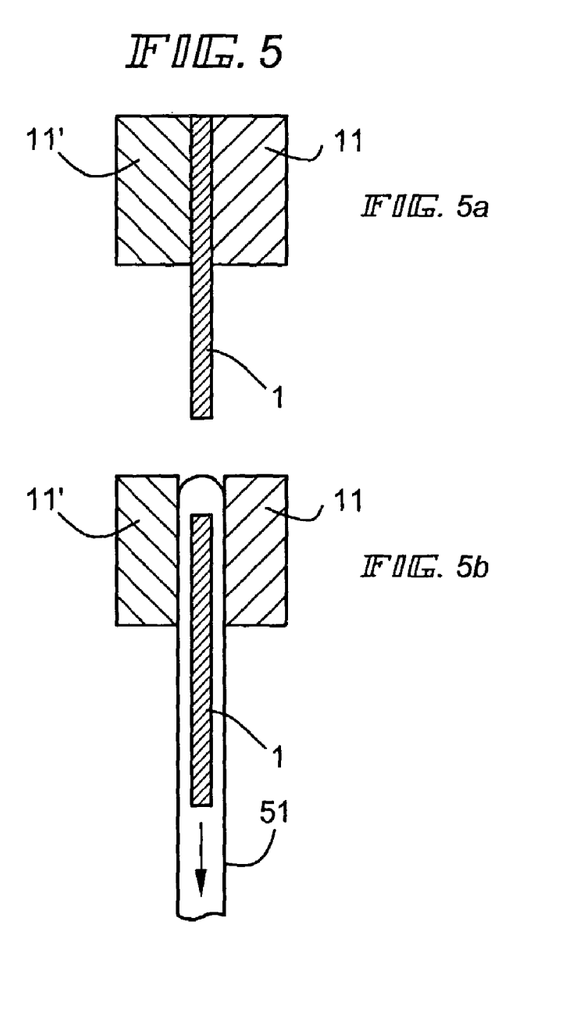
FIGS. 5A, 5B are sectional views showing the action of a guide member in a transfer mechanism.
Figure 6:
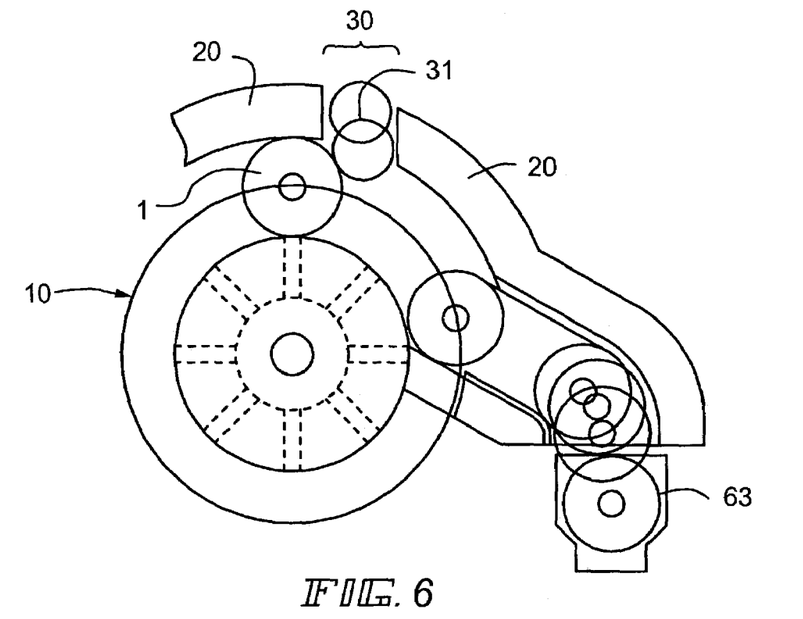
FIG. 6 is a front view showing another form of an unloading mechanism.

First, a scrub cleaning device according to one embodiment of the present invention will be described with reference to the drawings. FIG. 1 is a sectional view schematically showing a scrub cleaning device according to one embodiment of the present invention, FIG. 2 is a front view as seen excluding a front scrub pad, FIG. 3 is a sectional view of the scrub pad, FIG. 4 is a partial sectional view showing the state of a substrate held between two scrubbers, FIGS. 5A, 5B are sectional views showing the action of a guide member in a transfer mechanism, and FIG. 6 is a front view showing another form of an unloading mechanism.

The scrub cleaning device shown in FIG. 1 is constituted of a first cleaning station 100 for performing the scrub cleaning by a weak alkali cleaning liquid (the cleaning liquid other than the alkali cleaning liquid is also usable), a second cleaning station 300 for performing the scrub cleaning by pure water (the liquid other than pure water is also usable), and a transfer mechanism 200 for transferring the substrate cleaned in the first cleaning station to the second cleaning station. Additionally, three or more cleaning stations can be disposed in accordance with the necessary number of cleaning processes.

Each of the first and second cleaning stations is mainly constituted of a scrub pad 10 for performing the scrub cleaning of a substrate 1, a guide member 20 for conveying the substrate 1 to a cleaning point without dropping the substrate, a stopper mechanism 30 for temporarily stopping the substrate 1 at the cleaning point, and a cleaning liquid supply mechanism 40 for supplying the cleaning liquid to the scrub pad 10 and substrate 1. The scrub cleaning device is provided with a loading mechanism for taking the substrate from a cassette 61 for containing a plurality of substrates, and conveying the substrate to the first cleaning station, and an unloading mechanism for storing the cleaned substrate to an empty cassette 63.

Figure 2:
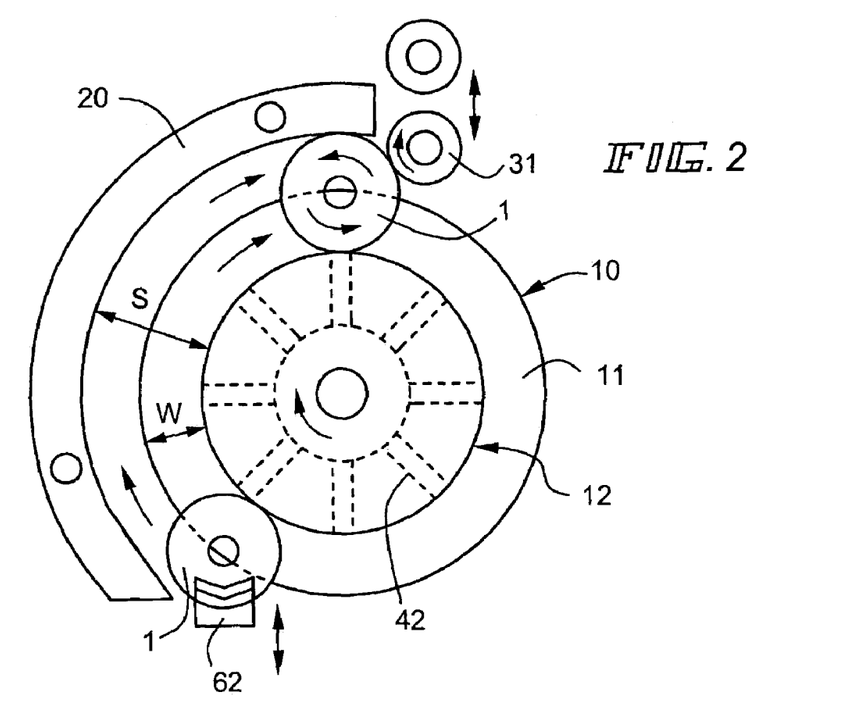
FIG. 2 is a front view of a device main part excluding a front scrub pad.
Figure 3:
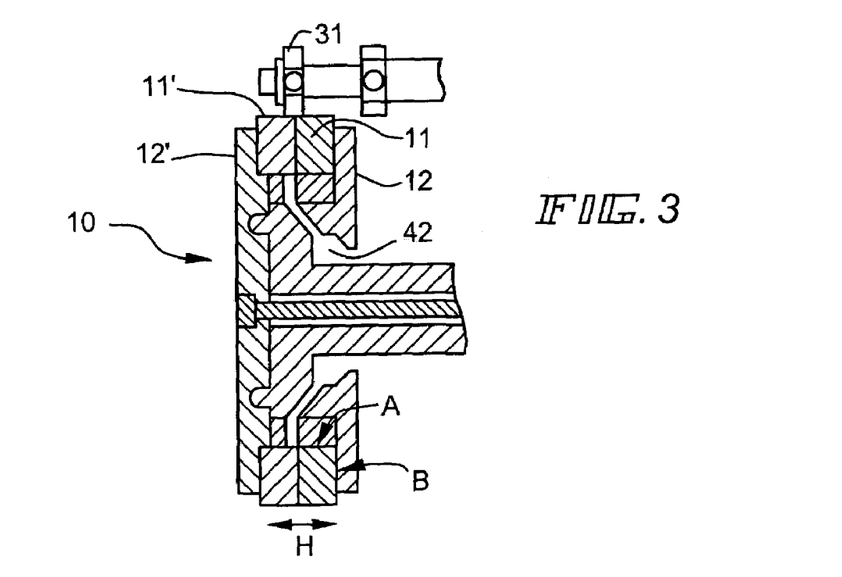
FIG. 3 is a sectional view of the scrub pad.
Figure 4:
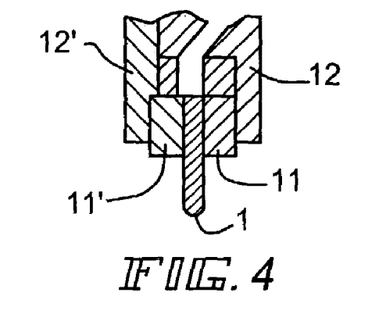
FIG. 4 is a partial sectional view showing the state of a substrate held between two scrubbers.
Figure 7:
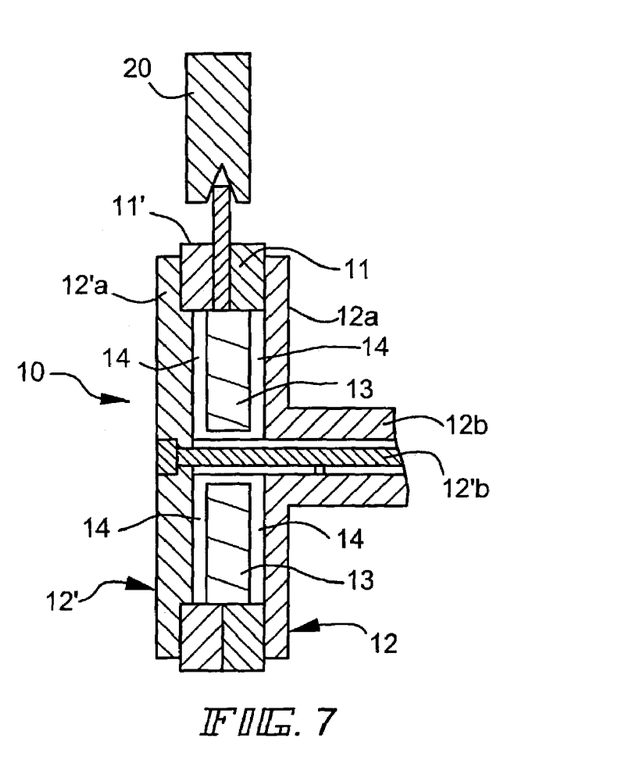
FIG. 7 is a sectional view showing one form of the scrub pad whose holding pressure can be adjusted.

In the present invention, as shown in FIGS. 2 to 4, the scrub pad 10 is provided with a function of holding at least a part of the substrate 1 from opposite sides of the substrate 1 and conveying the substrate 1 in the rotation direction of the scrub pad 10, and a function of performing the scrub cleaning of the substrate 1. The scrub pad 10 is connected to a rotation mechanism (not shown) in which rotation speed can be adjusted (1 to 500 rpm), and is provided with two pieces of sponge (scrubbers) 11, 11' in the form of annular plates so that both surfaces of the substrate 1 can be scrubbed. The material of the sponge is polyvinyl alcohol (PVA). Two pieces of PVA sponge 11, 11' are supported by wheels 12, 12' on a sponge inner peripheral surface A, and a surface B opposite a scrub surface while the scrub surfaces fit each other. The wheels 12, 12' are rotatable around a center axis of the annular sponge plates 11, 11'. The width W of the annular sponge plate approximately corresponds to the radius of the substrate 1. As shown in FIG. 3, two pieces of sponge 11, 11' are provided with an opening/closing mechanism (not shown) to be openable/closable in the thickness direction H of the substrate 1, and the structure can be separated into the wheel 12 and sponge 11, and the wheel 12' and sponge 11'. Additionally, the scrubber is not limited to the sponge, and may be a brush with bristles planted thereon. Moreover, the holding pressure of the substrate 1 by two pieces of sponge 11, 11' is adjustable. For example, as shown in FIG. 7, when the scrub pad is constituted of the wheel 12 including a support 12$a$ for supporting the sponge 11 and a shaft 12$b$, the wheel 12' including a support 12'$a$ for supporting the sponge 11' and a shaft 12'$b$, and a roller 13 freely rotatable around the shaft 12'$b$ of the wheel 12', a gap 14 is disposed between the supports 12$a$ and 12'$a$, and the interval between the supports 12$a$ and 12'$a$ is adjusted, the holding pressure of the substrate 1 can be adjusted.

The guide member 20 is disposed in the outer peripheral part of the scrub pad 10, the guide member is disposed apart from the scrub pad by a distance S between the inner diameter of the scrubber (wheel outer diameter) and the guide member, and the distance is substantially the same as the diameter of the disc-shaped substrate 1. The distance S can be adjusted in the structure. The guide member 20 is formed of a material softer than the substrate material so that the substrate side surface fails to be damaged. When the substrate is formed of glass, the guide member is preferably formed of materials such as polyether ether ketone (PEEK) and Teflon. With rotation of the scrub pad 10, the substrate 1 held between two pieces of sponge 11, 11' is conveyed. During conveyance, the substrate 1 is prevented from dropping by the guide member 20.

The cleaning point for the scrub cleaning of the substrate can be disposed in an optional place in a path in which the substrate 1 is conveyed by the scrub pad 10 and guide member 20. The conveyed substrate is temporarily stopped at the cleaning point, and forcibly subjected to the scrub cleaning by the stopper mechanism 30 (e.g., a rotatable free roller 31), formed of a Teflon material, for temporarily stopping the conveyed substrate 1. Specifically, as shown in FIGS. 1 and 2, the lower half of the substrate 1 is rotated in the same direction as that of the scrub pad 10, the substrate 1 is rotated in a direction reverse to that of the scrub pad 10, and the free roller 31 is rotated in the same direction as that of the scrub pad 10. In order to transfer the substrate 1 to the next cleaning station after the scrub cleaning of the substrate, the stopper mechanism 30 is provided with a mechanism (not shown) for retracting the free roller 31 to a position where the roller fails to contact the substrate 1. Additionally, the stopper mechanism can be disposed in a plurality of places in one cleaning station. Moreover, as the stop means (inhibition means), instead of the free roller, there may be provided a rotary roller driven by a drive system, or inhibition means which is formed of a soft material failing to damage the substrate and which fails to rotate.

The cleaning liquid supply mechanism 40 is provided with a supply path 41 for spraying the cleaning liquid in the vicinity of the substrate surface, and a supply path 42 for supplying the cleaning liquid to the outside from the inside of the scrub pad (the side which abuts on the substrate). In the latter path, as shown in FIGS. 2 and 3, the cleaning liquid is supplied from the side surface of the wheel, and supplied to the inner peripheral surface of the scrubber 11 via the supply path 42 radially extending inside the wheel. In this case, the cleaning liquid can be supplied not from the side surface of the wheel 12, but from the supply path passed through the wheel rotation shaft.

Concretely, for the cleaning liquid for use, for example, in the supply path 42 to the scrub pad, pure water is supplied for both the first and second cleaning stations. Moreover, since the cleaning by the weak alkali cleaning liquid is performed in the first cleaning station, the weak alkali cleaning liquid is supplied to the supply path 41 for spraying the cleaning liquid to the vicinity of the substrate surface from a cleaning liquid storage tank for containing the weak alkali cleaning liquid via a pump. Since the cleaning by pure water is performed in the second cleaning station, pure water is supplied to the supply path 41.

The transfer mechanism 200 for transferring the substrate subjected to the cleaning in the first cleaning station 100 to the second cleaning station 300 is constituted of a guide member 51, and a rotary roller 52 formed of the same material (sponge) as that of the scrubber of the scrub pad 10. The rotary roller 52 is rotated in an arrow direction by a rotation shaft 53. The guide member 51 releases the conveyed substrate 1 held between the two pieces of sponge 11, 11' as shown in FIG. 5A by opening the sponge 11, 11' outward as shown in FIG. 5B. Additionally, as the material of the rotary roller, a soft material which fails to damage the substrate surface is preferable. In order to prevent the scrub pad of the rotary roller from drying, there can be provided the supply mechanism 40 for supplying pure water and a supply path 43. Additionally, the substrate can be transferred simply by the guide member utilizing the rotation of the substrate without disposing the rotary roller 52.

The cleaning device of the present invention is provided with a loading mechanism for taking the substrate from the container cassette 61 for containing a plurality of substrates, and conveying the substrate to the first cleaning station 100. Here, in the container cassette 61, the respective substrates are disposed apart from one another by 6 mm, and 25 substrates can be contained (the number of contained substrates, and the distance between the substrates can appropriately be designed and changed in accordance with the substrate size, and the like). The bottom surface of the container cassette 61 has an opening to such an extent that a hand member 62 for holding the substrate in the loading mechanism can pass. The container cassette 61 in which the substrates are arranged moves at the stroke for the detaching process of the respective substrates, and the hand member 62 of the loading mechanism transfers the substrate to the space between two pieces of sponge 11, 11' of the first cleaning station. Numeral 64 denotes a stopper.

The cleaned substrate is stored in the container cassette 63 via a guide 65 by the unloading mechanism. Additionally, the substrate can be stored in a form in which the guide member is obliquely directed downward as shown in FIG. 6.

A scrub cleaning method will next be described according to one embodiment of the present invention.

In the container cassette, 25 magnetic recording medium glass substrates of one inch size (outer diameter of 27.4 mm, inner diameter of 7.0 mm) subjected to precision polishing- and chemical reinforcement are set. The container cassette is placed on the loading point of the above-described scrub cleaning device of the present invention (immersed in pure water).

The glass substrate 1 disposed in the container cassette 61 is conveyed by the hand member 62 of the loading mechanism to the scrubber position of the first cleaning station 100 which rotates at a rotation speed of 100 rpm. The glass substrate 1 held between two pieces of sponge 11, 11' moves to the cleaning point between the guide member 20 and the wheels 12, 12'.

In the cleaning point, by stopping the conveyance of the glass substrate 1 for several seconds (about 1 to 6 seconds) by the stopper mechanism of the free roller 31, spraying the weak alkali cleaning liquid to the main surface of the substrate from the supply path 41, supplying pure water to the sponge pieces 11, 11' from the supply path 42 and rotating the substrate 1 and sponge in opposite directions, the scrub cleaning is performed. The substrate rotation speed is preferably of the order of 2 to 5 rps.

After the scrub cleaning in the first cleaning station, the stopper of the free roller 31 is released, and the rotating substrate 1 moves to the transfer mechanism 200. In the transfer mechanism 200, as shown in FIG. 5B, the guide member 51 opens the sponge pieces 11, 11' outward, the held substrate 1 is released, and the substrate 1 is held between the opposite rotary rollers 52 and conveyed to the second cleaning station. Pure water is supplied to the rotary roller 52 from the supply path 43 to prevent the substrate from drying.

Similarly as in the first cleaning station 100, the substrate 1 having reached the second cleaning station 300 rotates between the wheel 12 and the guide member 20, and moves to the cleaning point, in which the scrub cleaning is performed by pure water from the supply path 41 (about 1 to 6 seconds).

After the scrub cleaning in the cleaning point ends, the stopper of the free roller 31 is released, the substrate 1 rotates and moves, and the substrate is stored in the container cassette 63 of the unloading point (immersed in pure water).

The obtained substrate had no dirt, no cleaning unevenness, or no damage, and the cleanliness was satisfactory. Moreover, time required for cleaning 25 glass substrates was as short as 45 seconds (1.8 seconds/substrate)

In the present invention, in the device a sensor for detecting the substrate is disposed, and substrate flow can be controlled and managed. For example, as shown in FIG. 8, the container cassette 61, a cleaning point 101 of the first cleaning station, a cleaning point 201 of the second cleaning station and the container cassette 63 are provided with substrate detecting sensors 71, 72, 73, 74, respectively, so that the substrate flow can be controlled and managed. In FIG. 8, the sensor 71 confirms the presence/absence of the substrate 1 in a substrate discharge position in the container cassette 61. The sensor 72 confirms the presence/absence of the substrate 1 in the cleaning point 101 of the first cleaning station. The sensor 73 confirms the presence/absence of the substrate 1 in the cleaning point 201 of the second cleaning station. The sensor 74 confirms the presence/absence of the substrate 1 in the substrate storage position in the container cassette 63. In the container cassette 61, after the sensor 71 confirms that the substrate 1 exists in the substrate discharge position, and the sensor 72 further confirms that the substrate 1 fails to exist in the cleaning point 101 of the first cleaning station, the substrate 1 is conveyed to the space between the constantly rotating sponge pieces 11 and 11'. (not shown) of the scrub pad 10. When the sensor 71 confirms that the substrate 1 fails to exist in the substrate discharge position, the cassette is moved to the next substrate discharge position. In the cleaning point 101 of the first cleaning station, the substrate 1 reaches the position of the free roller 31, the sensor 72 confirms the presence of the substrate 1, then a timer operates and the cleaning is performed in the cleaning point 101 for a fixed time. After it is confirmed that a timer set time elapses (time-up), and the sensor 73 further confirms that no substrate 1 exists in the cleaning point 201 of the second cleaning station, the free roller 31 is retracted and the substrate 1 is passed. When the substrate is passed, the free roller 31 is immediately lowered to its original position. In the cleaning point 201 of the second cleaning station, when the substrate 1 reaches the position of the free roller 31 and the sensor 73 confirms the presence of the substrate 1, the timer operates and the cleaning is performed in the cleaning point 201 for the fixed time. After it is confirmed that the timer set time elapses (time-up), and the sensor 74 further confirms that no substrate 1 exists in the substrate storage position in the container cassette 63, the free roller 31 is retracted and the substrate 1 is passed. When the substrate is passed, the free roller 31 is immediately lowered to its original position. In the container cassette 63, when the sensor 74 confirms that the substrate 1 exists in the substrate storage position, the cassette is moved to the next substrate storage position. In this manner, by passing the substrate after it is confirmed that no substrate exists in the prior process position, a trouble can be prevented from being caused by collision of the substrate. A flowchart showing the aforementioned operation or a signal system diagram is shown in FIG. 9.

Additionally, preferably employed is a system which comprises: confirming by the sensor and timer mechanism that the substrate fails to reach the corresponding position even when time required for a series of processes from the discharging to the storing of the substrate elapses, or confirming by the respective sensors and timer mechanism that a predetermined operation time in each sensor position elapses, notifying troubles such as the catching and dropping of the substrate by a buzzer or the like, or stopping the device.

The position and number of the sensors are not limited to the form shown in the drawing, and can appropriately be set. The sensor type is not limited as long as the substrate can be detected, and for example, a sensor for detecting the substrate by reflection of laser beams can be used.

It goes without saying that the respective operations can be performed only by time management without disposing any sensor.

EXAMPLE 2

After the 25 scrub-cleaned glass substrates in Example 1 were dried, an NiAl seed layer a CrV underlayer, a CoPtCrB magnetic layer and a carbon protective layer were formed on the main surface of each glass substrate by sputtering, and a perfluoro-polyether lubricating layer was then formed by a dipping method to prepare magnetic discs. For the thus prepared magnetic discs, a glide test and a record regenerative test by an MR (magnetic reluctance type) head were made, but neither a hit nor a thermal asperity was generated, so that the magnetic discs having a high reliability were obtained.

The present invention is not limited to the scope described in the above embodiment, and can appropriately be modified and implemented.

Figure 10:
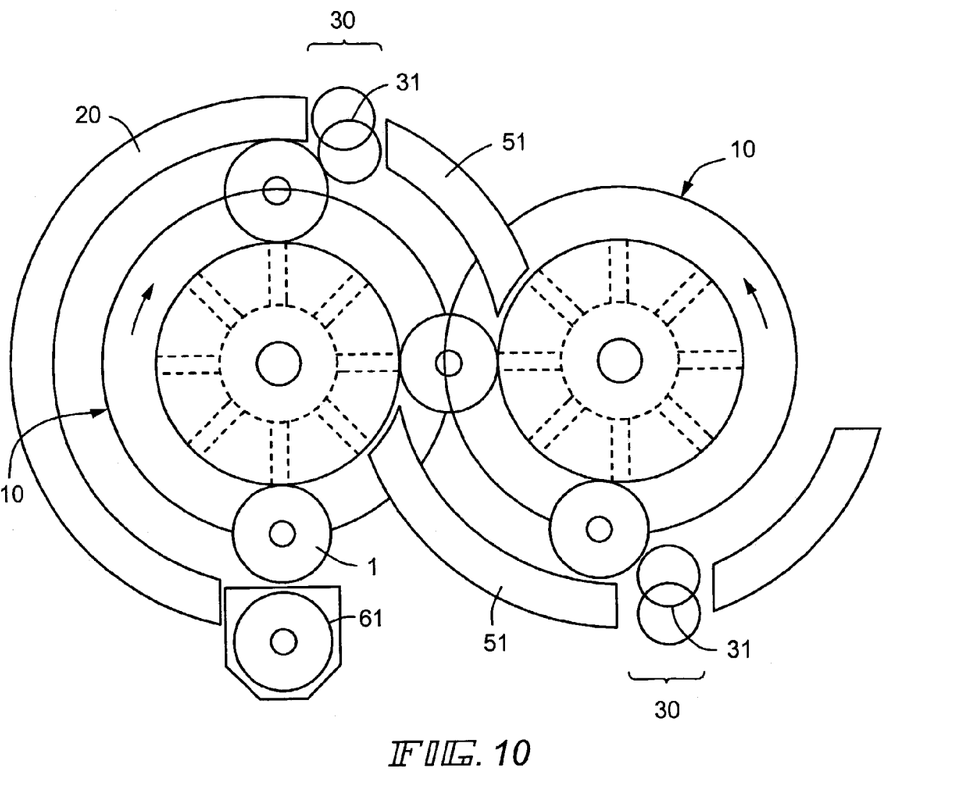
FIG. 10 is a sectional view schematically showing the scrub cleaning device according to another embodiment of the present invention.

For example, as shown in FIG. 10, the scrub cleaning device can be constituted by continuously combining a plurality of scrub pads 10 via the guide members 51.

Moreover, in the above-described embodiment, in order to forcibly perform the scrub cleaning of the substrate, the rotatable free roller is disposed, but by appropriately controlling the holding pressure of the substrate by the scrub pad, the holding amount of the substrate, the surface state of the abutment surface of the guide member on the substrate side surface, and the like, or changing the material, and making the peripheral speed difference between the substrate and the scrubber during conveyance of the substrate by the scrub pad, the scrub cleaning can be performed without disposing the free roller.

However, in the respective cleaning stations, the combination of the simultaneous substrate conveyance and scrub cleaning by rotation of the substrate during conveyance by the scrub pad, with the forcible implementation of the scrub cleaning of the substrate by the rotatable free roller or the like is most preferable. In this case, the scrubber rotation speed is preferably about 60 rpm, and the substrate rotation speed is preferably of the order of 3 to 4 rps. The rotation of the substrate during conveyance of the substrate is also preferable in that the wet scrubber can prevent the substrate from drying.

Moreover, during substrate conveyance or during the scrub cleaning in the cleaning point, the scrubbers disposed on both sides of the substrate can be rotated at the same or different rotation speed in the same or different rotation direction.

The scrubber is not limited to the annular plate shape, and can be formed in a disc, planar, or belt shape. Moreover, the present invention is not limited to the form in which about the half of the substrate is held between the scrubbers, and the entire substrate, the half or more of the substrate, or the half or less of the substrate can be held between the scrubbers. Furthermore, a horizontally disposed device can be constituted.

A mechanism for removing or scraping dirt sticking to the scrubber or a self cleaning mechanism of the scrubber can be disposed midway in the path of the scrubber.

Additionally, the guide member 51 shown in FIGS. 1 and 5 has an action of scraping the dirt sticking to both scrubbers of the first and second cleaning stations, and maintenance for removing the dirt sticking to the scrubber is usually unnecessary.

Figure 11:
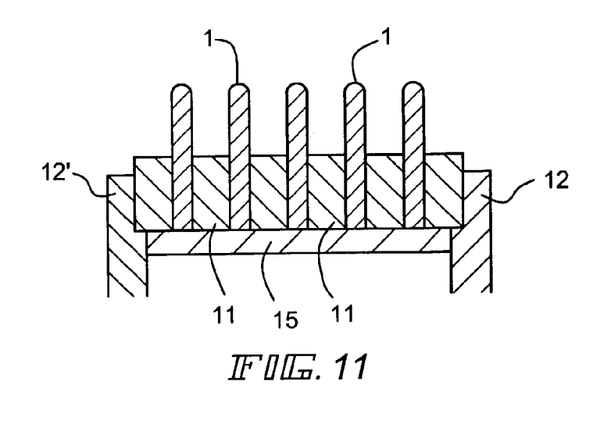
FIG. 11 is a sectional view showing one form of the scrub pad which can simultaneously treat a plurality of substrates.

For the structure of the scrub pad, for example, as shown in FIG. 11, two or more substrates 1 can simultaneously be treated by a plurality of pieces of sponge 11, and the treatment ability can remarkably be enhanced. In this case, for the number of simultaneously treated substrates, in consideration of automation with the processes before and after the cleaning process by the device of the present invention, the number obtained by dividing the number of substrates contained in the cassette by an integer (e.g., 1 or 5 for the cassette containing 25 substrates) is preferable. Additionally, in the structure of FIG. 11, the respective sponge pieces 11 positioned in the middle are supported by a support member 15, but as shown in FIG. 4 or 7, the scrub pads in which the scrubbers 11, 11' are supported by the wheels 12, 12' can laterally be arranged in the structure. In these cases, the middle wheel can be shared.

In FIGS. 1 to 3, 6, 10, as a mechanism for driving the free roller 31 or the like, for example, a rotary actuator is used, and as shown in FIG. 8, a mechanism for moving the actuator on a circular arc track 32 can be employed.

In FIGS. 1 to 3, 6, 8, 10, as the structure of the guide member, for example, the sectional structure of the guide member 20 shown in FIG. 7 can be employed.

As the substrate to be cleaned, a magnetic disk glass substrate, an optical disk glass substrate, an optical magnetic disk glass substrate, a semiconductor silicon wafer, and the like are exemplified.

As the substrate material, glass (including chemical reinforcement glass, crystallized glass, and the like), ceramic, glass ceramic, silicon, carbon, metal, and the like are exemplified.

The examples of the substrate shape include a circular shape, a disc shape (including an orifice flange), and the like.

The substrate size is not particularly limited, but in addition to the one inch size, the present invention can be applied, for example, to a 2.5 inch size, 3.0 inch size, 3.5 inch size (for a magnetic disk), and other sizes.

For the process in which the cleaning is performed, the cleaning is performed, for example, after the grinding/polishing of the substrate, after chemical reinforcement of the substrate, before or after film formation on the substrate, and the like. In these cases, a cleaning/drying process in which the usual scrub cleaning is not performed is preferably combined after the scrub cleaning by the present invention, so that more complete cleaning can be performed.

Examples of the cleaning liquid include pure water, alkaline cleaning liquid, acidic cleaning liquid, neutral detergent, and other commercial detergents.

As the scrubber material in the scrub pad 10, rotary roller 52, and the like, a sponge-like material (e.g., PVA), a nylon brush, a synthetic leather, and other known scrubber materials can be used. As the material of the rotary roller 31, rubber and other elastic materials can be used.

Examples of the transfer mechanism include the rotary roller, the guide member, and the like.

Figure 12:
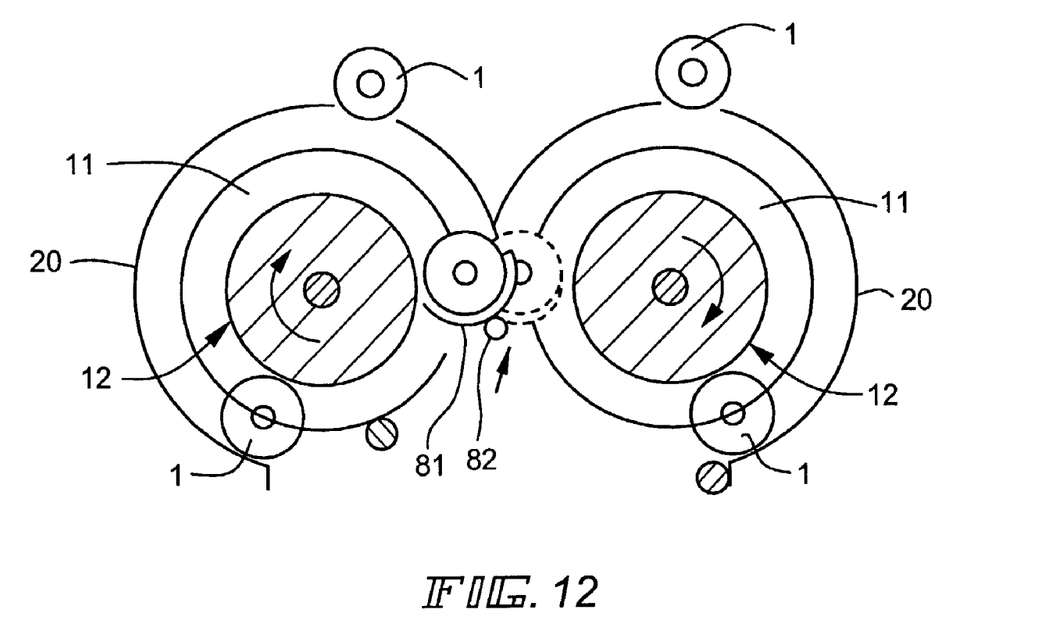
FIG. 12 is a main part front view showing another form of the transfer mechanism.

As the transfer mechanism, for example, as shown in FIG. 12, a substrate bearing 81 provided with an oscillating mechanism is disposed between the cleaning stations, and transfer can be performed by receiving the substrate 1 from the first cleaning station 100 by the substrate bearing 81, subsequently, allowing the substrate bearing 81 to oscillate centering on a support point 82, directing the substrate bearing toward the second cleaning station 200 as shown by a dotted line, and pushing the substrate 1 in an arrow direction by a pushing arm or the like.

As other transfer mechanisms, a mechanism of disposing the substrate bearing on the tip end of a lever for reciprocating angular movement and performing substrate transfer similarly as described above, and a transfer mechanism utilizing a robot arm can also be employed.

The form of the scrubber and the positional relation of the guide member, and the like are not limited to the above-described embodiments. For example, there can be provided a scrub cleaning device which comprises: means for moving the scrubber while at least a part of the substrate is held between two opposite scrubbers, and conveying the substrate in the movement direction of the scrubber (e.g., a belt scrubber extended between belt wheels); friction generation means (e.g., the guide member), disposed along the conveyance direction of the substrate, for contacting the conveyed substrate to generate a friction; a substrate cleaning section for conveying the substrate and rotating the substrate by the friction force generated by abutment of the substrate on the friction generation means, and performing the scrub cleaning of the substrate during conveyance of the substrate; a substrate introducing section for conveying the substrate to the substrate cleaning section; and a substrate discharging section for conveying the substrate from the substrate cleaning section.

According to the scrub cleaning method and device of the present invention, the scrubber for performing the scrub cleaning is provided with the function of conveying the substrate to the respective cleaning points, the conveyance and transfer of the substrate are smoothly performed, the time for transfer to the next cleaning station is short, and the cleaning time is therefore reduced.

Furthermore, the disc substrate can be conveyed without supporting the central hole, and hence there is not any fear that the central hole is worn to form dust, so that the generation of a thermal asperity due to the formation of the dust from the central hole can be prevented, whereby the information recording medium (e.g., a magnetic disk) having a high reliability can be manufactured.

Moreover, since it is unnecessary to dispose a large-scaled device for supporting each of the respective substrates and conveying or transferring the substrate to the cleaning point or the next cleaning station, the device can be simplified and miniaturized, and the space can be saved.

Furthermore, there is no fear of dust generation by the rubbing of the central hole, the substrate fails to dry in the cleaning process and the dirt can easily be removed.

For the scrub cleaning method and device of the present invention, even when a plurality of cleaning processes are performed, the cleaning time is short, and it is unnecessary to dispose the large-scaled transfer device, which is useful particularly for performing a plurality of cleaning processes.

As the substrate to be cleaned according to the present invention, disc-shaped substrates such as the information recording medium substrate are exemplified. The present invention is suitable particularly for the one-inch substrate, and other substrates difficult to transfer or clean because of the small size.

What is claimed is:
1. A scrub cleaning device comprising:
a pair of planar scrubbers having their scrub surfaces disposed opposite to each other and holding a substrate rotatably therebetween;

means for rotating the pair of planar scrubbers around a rotation shaft vertical to the planar scrubbers for conveying the substrate held between the pair of planar scrubbers;

a substrate inlet section for introducing the substrate between the pair of planar scrubbers;

a first cleaning point for temporarily holding the substrate being conveyed by the pair of planar scrubbers and for rotating the substrate at a holding position with a rotation axis of the substrate fixed, to perform a first scrub cleaning of the substrate;

a guide member disposed along a conveyance direction of the substrate for abutting a part of a circumference of the substrate being conveyed by the pair of planar scrubbers to guide the conveyance of the substrate to the first cleaning point; and a second cleaning point including means for rotating the substrate with the rotation axis of the substrate not fixed, by a friction force generated by the abutment of the guide member with the substrate causing the substrate and the planar scrubbers to rub each other, to perform a second scrub cleaning of the substrate while the substrate is conveyed by the rotation of the planar scrubbers.

2. A scrub cleaning device according to claim 1, wherein the first cleaning point comprises a stopper mechanism including means for abutting the substrate being conveyed by the pair of planar scrubbers to temporarily hold the substrate, so that the first scrub cleaning of the substrate is performed by rotating the substrate at the holding position with a rotation axis of the substrate fixed.

3. The scrub cleaning device according to claim 1 or 2, comprising cleaning liquid supply means for supplying a cleaning liquid to at least one of the pair of scrubbers and the substrate held between the pair of scrubbers.

4. The scrub cleaning device according to claim 1 or 2, comprising a substrate outlet section for discharging the substrate being conveyed by the pair of scrubbers from between the pair of scrubbers.

5. The scrub cleaning device according to claim 2, comprising a sensor for confirming the presence/absence of the substrate in the stopper mechanism, wherein the substrate inlet section introduces the substrate between the pair of scrubbers when absence of the substrate is confirmed by the sensor.

6. A scrub cleaning device comprising:

a plurality of cleaning stations comprising the device of claim 1 or 2; and a conveyance mechanism for conveying a substrate cleaned in the cleaning station to the next cleaning station in said plurality of cleaning stations.

7. The scrub cleaning device according to claim 6, wherein said conveyance mechanism comprises a guide member for connecting the scrubbers of said plurality of cleaning stations to one another.

8. The scrub cleaning device according to claim 6, wherein said conveyance mechanism comprises a guide member for connecting the scrubbers of said plurality of cleaning stations to one another, and a scrub roller for holding the substrate along the guide member from opposite sides and conveying the substrate.

9. The scrub cleaning device according to claim 1 or 2, wherein the pair of scrubbers is disposed vertically.

10. The scrub cleaning device according to claim 1 or 2, wherein the substrate is a glass substrate for an information recording medium.

* * * * *